(12) United States Patent
Greeff et al.

(10) Patent No.: US 8,400,810 B2
(45) Date of Patent: *Mar. 19, 2013

(54) ENHANCED PERFORMANCE MEMORY SYSTEMS AND METHODS

(75) Inventors: Roy E. Greeff, Boise, ID (US); David K. Ovard, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/163,219

(22) Filed: Jun. 17, 2011

(65) Prior Publication Data

US 2011/0248743 A1 Oct. 13, 2011

Related U.S. Application Data

(63) Continuation of application No. 11/846,371, filed on Aug. 28, 2007, now Pat. No. 7,965,532.

(51) Int. Cl.
*G11C 5/06* (2006.01)
(52) U.S. Cl. ............ 365/63; 365/148; 365/230.05
(58) Field of Classification Search .......... 365/63, 365/230.05, 148
See application file for complete search history.

(56) References Cited

U.S. PATENT DOCUMENTS

| | | | |
|---|---|---|---|
| 5,825,162 A | 10/1998 | Kida et al. | |
| 6,493,394 B2 | 12/2002 | Tamura et al. | |
| 7,167,945 B2 | 1/2007 | Feldstein et al. | |
| 7,199,681 B2 * | 4/2007 | Amirtharajah et al. | 333/130 |
| 7,965,532 B2 * | 6/2011 | Greeff et al. | 365/63 |
| 2002/0084458 A1 | 7/2002 | Halbert et al. | |
| 2009/0063789 A1 | 3/2009 | Greeff et al. | |

FOREIGN PATENT DOCUMENTS

| | | |
|---|---|---|
| EP | 0046408 A1 | 2/1982 |
| EP | 0254473 A2 | 1/1988 |
| WO | WO-2009032152 A1 | 3/2009 |

OTHER PUBLICATIONS

"Taiwanese Application Serial No. 097132920, Office Action mailed May 29, 2012", 17 pgs.
"Taiwanese Application Serial No. 097132920, Response to Office Action filed Aug. 28, 2012", 14 pgs.

* cited by examiner

*Primary Examiner* — Son Dinh
(74) *Attorney, Agent, or Firm* — Schwegman, Lundberg & Woessner, P.A.

(57) ABSTRACT

Digital memory devices and systems, including memory systems and methods for operating such memory systems are disclosed. In the embodiments, a memory system may include a processor and a memory controller communicatively coupled to the processor. A memory bus communicates with at least two memory units through the memory bus. At least one divider unit may be interposed between the memory bus and the at least two memory units that is configured to approximately equally divide levels of received signals while matching an impedance of the memory bus to an impedance of the memory units.

18 Claims, 10 Drawing Sheets

ENHANCED PERFORMANCE MEMORY SYSTEMS AND METHODS

PRIORITY APPLICATION

This application is a continuation of U.S. application Ser. No. 11/846,371, filed Aug. 28, 2007 now U.S. Pat. No. 7,965,532, which is incorporated herein by reference in its entirety.

BACKGROUND

Various digital systems, such as general-purpose computational devices, digital signal processors, video devices, and the like, generally include a processor configured to interpret and process encoded instructions, an attached high-speed memory system. The encoded instructions control the various processing operations of the processor, and are generally stored in selected portions of the memory system, which usually also contains at least a portion of the data to be processed. A memory bus is sometimes present, which serves as a communications channel between the processor and the memory system, so that the encoded instructions and the data may be communicated between the processor and the memory system.

The performance of a digital system may be defined by its speed and efficiency in processing the data. The performance of the digital system therefore includes the speed of the processor in performing arithmetic operations, the adaptability of the digital system to changing user requirements, and other contributing factors. Among these factors is the operating speed of the memory, as well as the availability of the memory for access by the processor.

Another significant performance factor can be the bandwidth supported by the memory bus. The theoretical bandwidth of the bus may be simply estimated by forming the product of the clock rate and the data delivered per clock cycle. For example, if eight bytes are communicated per clock cycle, and the clock rate is 100 MHz, then the theoretical bandwidth of the bus is 0.80 Gigabytes/second. This estimate is based upon full utilization of the bus (e.g., the falling edge of the clock cycle always communicates eight bytes), with no memory latency effects present to decrease the theoretical bandwidth to a somewhat lower sustained bandwidth.

Due to increasing system speeds, bandwidth limitations have become a significant problem. In one known method, the bandwidth of the bus may be increased by increasing the physical width of the bus. As the physical dimensions of integrated circuit devices steadily decrease, however, competition for available "real estate", or layout space on the device may be strictly limited. In another known method, the bandwidth of the memory bus may be increased by increasing the clock speed of the bus. It is generally understood, however, that limitations also presently exist with regard to increasing the speed of the bus. For example, impedance differences may cause undesired signal reflections within the bus, which adversely affect the overall performance of the system. Further, signal isolation problems may also arise as operational frequencies are further increased.

BRIEF DESCRIPTION OF THE DRAWINGS

Embodiments are described in detail in the discussion below and with reference to the following drawings.

DETAILED DESCRIPTION

Various embodiments of the invention include digital memory devices and systems, such as memory systems and methods for operating memory systems in conjunction with high speed processing systems. Many specific details of various embodiments of the invention are set forth in the following description and in FIGS. 1 through 16 to provide a thorough understanding of such embodiments. One of ordinary skill in the art, however, will understand that additional embodiments are possible, and that many embodiments may be practiced without several of the details disclosed in the following description.

Figure 1:
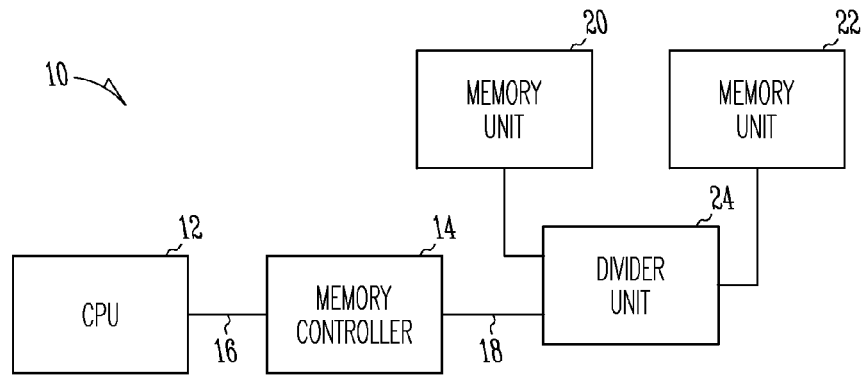
FIG. 1 is a diagrammatic block view of a memory system, according to various embodiments.

FIG. 1 is a diagrammatic block view of a memory system 10, according to one or more embodiments. The memory system 10 includes a central processing unit (CPU) 12 that is coupled to a memory controller 14 by a local bus 16. The CPU 12 may generally include any digital device configured to receive programmed instructions and data, and to process the data according to the programmed instructions. The memory controller 14 may include various digital circuits that are operable to manage information that is transferred to and from the CPU 12 along the local bus 16. Although FIG. 1 shows the CPU 12 and the memory controller 14 as distinct functional blocks, it is understood that various alternative physical arrangements are possible. For example, the memory controller 14 may be physically positioned on a die that also includes the CPU 12, so that memory latency effects are minimized. Alternatively, the CPU 12 and the memory controller 14 may be implemented on separate dice that are operably coupled and positioned on a common circuit assembly, such as a "motherboard", or other similar circuit assemblies.

The memory controller 14 may also be implemented in still other arrangements. For example, the memory controller 14 may be incorporated as a chipset positioned on a motherboard, perhaps including one or more memory controller hubs, such as a "northbridge", and one or more input/output (I/O) controller hubs, such as a "southbridge", so that the memory controller 14 is incorporated at least in part, in the northbridge that is configured to handle information communicated between the CPU 12 and various memory devices (to be discussed subsequently), as well as communications functions between the CPU 12 and other devices, such as a graphics card.

The local bus 16 may include a plurality of parallel signal lines, which are operable to provide generally bidirectional point-to-point communications between the CPU 12 and the memory controller 14, but may also include other alternative arrangements that provide a similar logical functionality. Accordingly, the local bus 16 may include a "front-side" bus that couples the CPU 12 to the northbridge portion of a chipset.

The memory system 10 may also include a memory bus 18 that includes a plurality of generally parallel signal lines that provide bidirectional signal communication between the memory controller 14 and a first memory unit 20 and a second memory unit 22. Serial and other communication may also be used. Accordingly, the memory bus may be operably configured to communicate a variety of signals between the CPU 12 and the first memory unit 20 and the second memory unit 22. For example, the memory bus 18 may include lines configured to communicate data signals corresponding to actual data that is to be written to, or read from the first memory unit 20. Other lines within the memory bus 18 may be similarly configured to communicate still other signals, such address signals, which specify a location within one of the first memory unit 20 and the second memory unit 22 where data is to be written to, or read from. Command signals may also be communicated along selected lines in the memory bus 18, which may provide specific instructions to at least one of the first memory unit 20 and the second memory unit 22 concerning the type of operation that is to be performed (e.g., a read operation, a write operation, a refresh operation, or other various and known operations). Selected lines in the memory bus 18 may also be suitably configured to communicate control and clock signals so that other signals passing between the memory controller 14 and the first memory unit 20 and the second memory unit 22 are properly controlled and synchronized. Although the memory bus 18 may include separate signal lines for each signal, it is nevertheless understood that other alternative arrangements that provide a similar logical functionality may also be used.

The first memory unit 20 and the second memory unit 22 may include discrete memory devices, such as a static memory, a dynamic random access memory (DRAM), an extended data out dynamic random access memory (EDO DRAM), a synchronous dynamic random access memory (SDRAM), a double data rate synchronous dynamic random access memory (DDR SDRAM), a synchronous link dynamic random access memory (SLDRAM), a video random access memory (VRAM), a rambus dynamic random access memory (RDRAM), a static random access memory (SRAM), a flash memory, as well as other known memory devices.

Additionally, the first memory unit 20 and the second memory unit 22 may also include memory modules having a plurality of discrete memory devices that are mounted on a common and generally removable circuit assembly. For example, the first memory unit 20 and the second memory unit 22 may include a dual in line memory module (DIMM) having a plurality of memory devices that are generally configured to operate in parallel.

When the first memory unit 20 and the second memory unit 22 include memory modules, still other physical arrangements are possible. For example, the first memory unit 20 and the second memory unit 22 may include other memory modules, such as a double data rate synchronous dynamic random access memory (DDR SDRAM), a double data rate two synchronous dynamic random access memory (DDR2 SDRAM), a double data rate three synchronous dynamic random access memory (DDR3 SDRAM), as well as other suitable memory modules.

Still referring to FIG. 1, the memory system 10 may include a divider unit 24 coupled to the memory bus 18 and the memory unit 20 and the memory unit 22. The divider unit 24 is interposed between the memory bus 18 and the memory unit 20 and the memory unit 22, and thus controls signal communication between the bus 18 and the memory unit 20 and the memory unit 22. In addition, the divider unit 24 is configured to divide a signal level supplied to the first memory unit 20 and the second memory unit 22 so that approximately equivalent signal levels are transferred to the first memory unit 20 and the second memory unit 22. In addition, the divider unit 24 provides isolation between the divided and approximately equivalent signal levels. Accordingly, the divider unit 24 may include various passive circuit elements, or a combination of active and passive elements. Since the divider unit 24 may be configured to divide and/or to combine signals, it is generally a bidirectional device. The divider unit 24, according to various embodiments, will be discussed in greater detail below.

Figure 2:
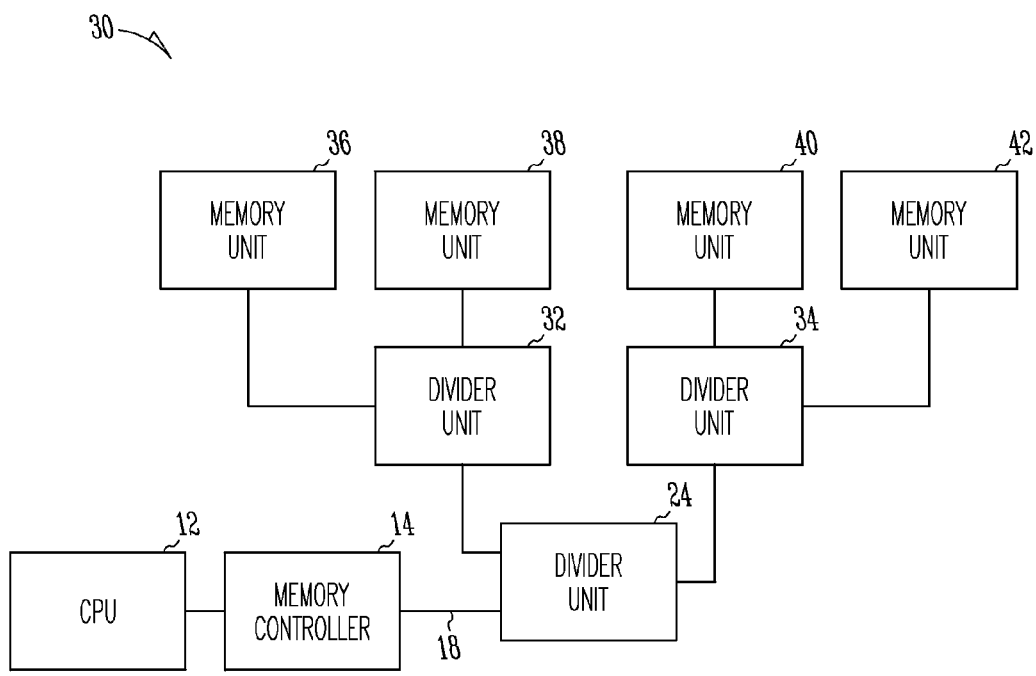
FIG. 2 is a diagrammatic block view of a memory system, according to various embodiments.

FIG. 2 is a diagrammatic block view of a memory system 30, according to one or more embodiments. Many of the various elements of the memory system 30 have been previously described in detail, and in the interest of brevity, such elements will not be described further. The memory system 30 may include at least a first secondary divider unit 32 and a second secondary divider unit 34 that are coupled to the divider unit 24. Accordingly, a signal level received from the bus 18 is approximately first equally divided by the divider unit 24, and each divided signal level may then be supplied to the first secondary divider unit 32 and a second secondary divider unit 34, each of which further approximately equally divides the previously divided signal level. The divided (and approximately equivalent) signal levels generated by the first secondary divider unit 32 and a second secondary divider unit 34 may then be supplied to memory units 36-42. The arrangement of divider units in discrete stages, as shown in FIG. 2, may provide enhanced bandwidth performance to the memory system 30. Although FIG. 2 shows the divider unit 24, and the first secondary divider unit 32 and a second secondary divider unit 34 as separate functional elements, it is nevertheless understood that the divider unit 24, and the first secondary divider unit 32 and a second secondary divider unit 34 may be physically combined into a common assembly, which may in turn, be combined into other physical structures within the memory system 30. Further, it is understood that it is within the scope of the various embodiments to combine still other divider units to couple still other additional memory units to the memory bus 18. Although the various divider units shown in FIG. 2 may embody a common functionality, it is understood that the various divider units in each stage may include internal components (to be discussed in greater detail below) having different component values, so that the various divider units may be configured to provide a suitable impedance match at each of the various stages.

Figure 3:
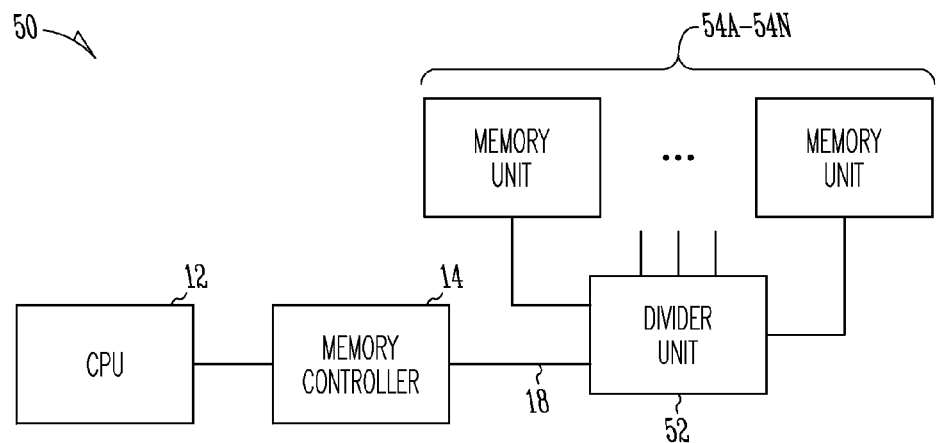
FIG. 3 is a diagrammatic block view of a memory system, according to various embodiments.

FIG. 3 is a diagrammatic block view of a memory system 50, according to one or more embodiments. Again, many of the various elements of the memory system 50, which are similar to or identical to the components in memory systems 10 and 30 of FIGS. 1 and 2, respectively, have been previously described, and will not be described further. Here it can be seen that the memory system 50 may include an n-way divider unit 52 configured to receive a signal level on the memory bus 18, and to divide the received signal level into n-approximately equivalent divided signal levels, which may then be communicated to memory units 54a-54n. The n-way divider unit 52 will be described in greater detail below.

Figure 4:
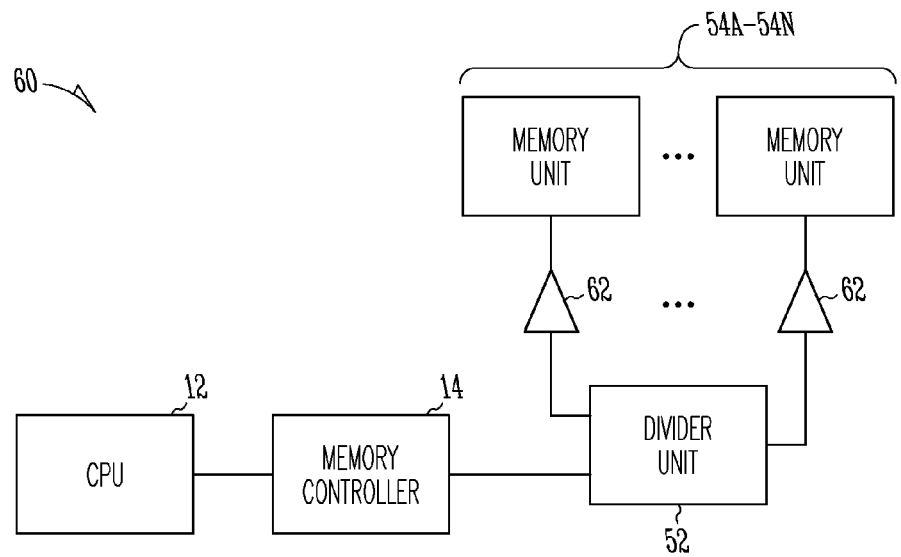
FIG. 4 is a diagrammatic block view of a memory system, according to various embodiments.

FIG. 4 is a diagrammatic block view of a memory system 60, according to one or more embodiments. Yet again, many of the various elements of the memory system 60 have been previously described, and will not be described further. The memory system 60 may include the n-way divider unit 52, as previously described. Since one or more of the divided signal levels generated within the n-way divider unit 52 may be significantly attenuated by the n-way divider unit 52, one or more signal boosting units 62 may be coupled to selected outputs from the n-way divider unit 52 and to selected inputs to the memory units 54a-54n, so that a suitable signal level may be communicated to the selected memory units 54a-54n. The one or more signal boosting units 62 may include, for example, one or more low-noise amplification stages that provide reasonable amplification and bandwidth. Accordingly, the amplification stages may include various semiconductor devices, such as field effect transistor devices (e.g., FETs, JFETs, MOSFETS) or even bipolar transistor devices. Although FIG. 4 shows the signal boosting units 62 separate from the n-way divider unit 52, it is understood that the signal boosting units 62 may be physically incorporated into the n-way divider unit 52.

Figure 5:
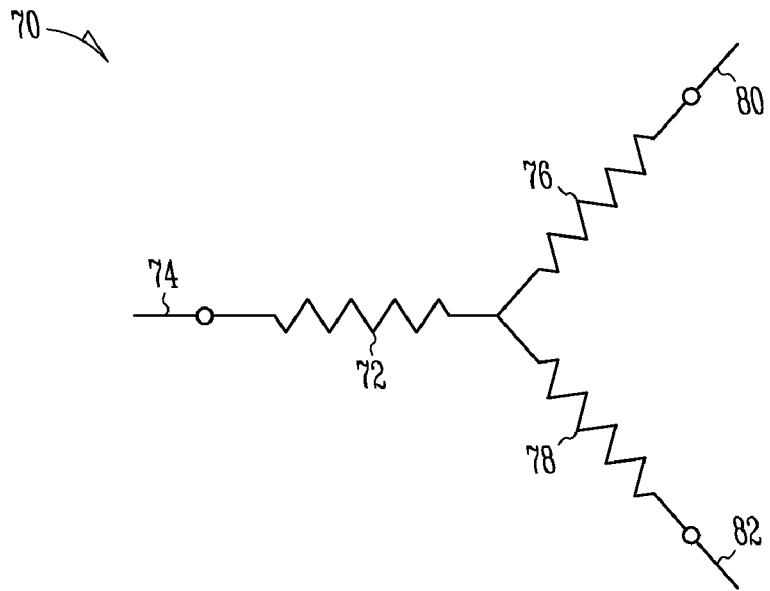
FIG. 5 is a schematic view of a divider unit according to various embodiments.

With reference now FIG. 5, a divider unit 70 may include a first impedance 72 that is serially coupled to a first port 74, which may, in turn, be coupled to the memory bus 18 (as shown in FIGS. 1-4). The divider unit 70 may also include a second impedance 76 and a third impedance 78 that are coupled to the first impedance 72. The second impedance 76 may be coupled to a second port 80, while the third impedance 78 may be coupled to a third port 82. The second port 80 and the third port 82 may, in turn, be coupled to memory units, such as, for example, the first memory unit 20 (as shown in FIG. 1) and the second memory unit 22 (as also shown in FIG. 1). In accordance with conventional terminology, it is therefore noted that the first impedance 72, the second impedance 76 and the third impedance 78 are arranged in a wye-coupled configuration. Since it is desired that the divider unit 70 comprise a matched network, with all of the ports matched to an impedance $Z_0$ (e.g., a characteristic impedance of the memory bus 18 of FIG. 1), each of the first impedance 72, the second impedance 76 and the third impedance 78 includes a value that is approximately one-third of the impedance $Z_0$.

Figure 6:
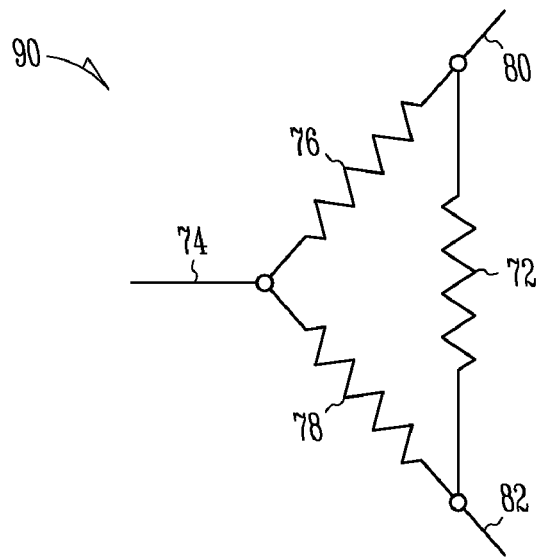
FIG. 6 is a schematic view of a divider unit according to various embodiments.

FIG. 6 is a schematic view of a divider unit 90 that also includes a first port 74 that may be coupled to the memory bus 18 (as shown in FIGS. 1-4), and a second port 80 and a third port 82 that may be coupled to memory units, such as the first memory unit 20 (as shown in FIG. 1) and the second memory unit 22 (as also shown in FIG. 1). The divider unit 90 therefore constitutes a delta-coupled arrangement that includes the first impedance 72, the second impedance 76 and the third impedance 78. Again, since it is desired that the divider unit 90 be a matched network, each of the first impedance 72, the second impedance 76 and the third impedance 78 includes a value that is approximately equal to the impedance $Z_0$.

With reference now specifically to FIG. 5 and FIG. 6, it is understood that the first impedance 72, the second impedance 76 and the third impedance 78 may be pure resistances, so that the divider unit 70 and the divider unit 90 may be substantially resistive networks. Although resistive networks advantageously provide wide bandwidth, and are relatively inexpensive to fabricate, signal attenuation values may be elevated (e.g., approximately about −6 dB) in comparison with subsequently discussed embodiments.

Figure 7:
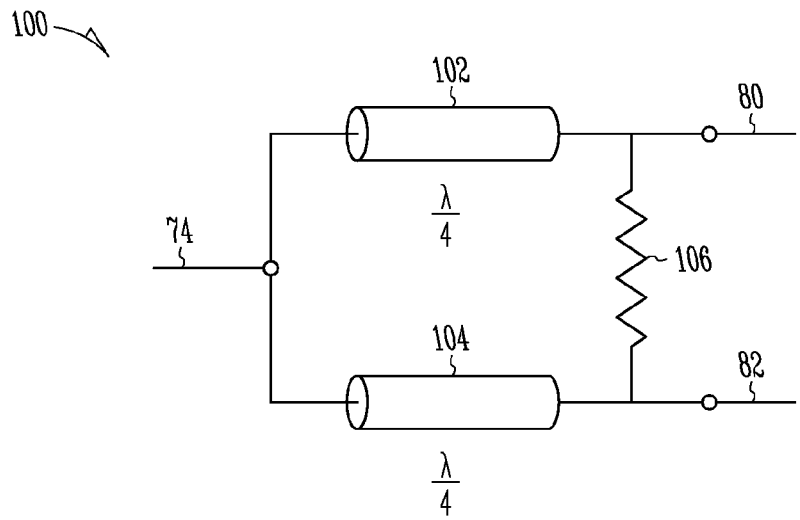
FIG. 7 is a schematic view of a divider unit according to various embodiments.

FIG. 7 is a schematic view of a divider unit 100 that also includes a first port 74 that may be coupled to the memory bus 18 (as shown in FIGS. 1-4), and a second port 80 and a third port 82 that may be coupled to respective memory units, such as the first memory unit 20 (as shown in FIG. 1) and the second memory unit 22 (as also shown in FIG. 1).

The divider unit 100 may include a first transmission line transformer 102 and a second transmission line transformer 104 that are arranged in a mutually parallel arrangement. The first transmission line transformer 102 and the second transmission line transformer 104 are generally configured to be tuned to one-quarter of an operational wavelength λ, and may be formed using an appropriately configured stripline, or micro-stripline transmission line, or by using other appropriately configured transmission lines.

The divider unit 100 may also include an impedance 106, which may be coupled to the second port 80 and a third port 82. In the various embodiments, the impedance 106 may comprise a selected resistance. In order to match the first port 74, the second port 80 and the third port 82 to the impedance $Z_0$, the first transmission line transformer 102 and the second transmission line transformer 104 may be configured or selected to provide an impedance of approximately $\sqrt{2}Z_0$, while the impedance 106 may be configured or selected to provide an impedance of approximately $2Z_0$. The various embodiments, which include transmission line transformers are recognized as exhibiting less signal attenuation than others of the various embodiments that employ resistive elements only.

Figure 8:
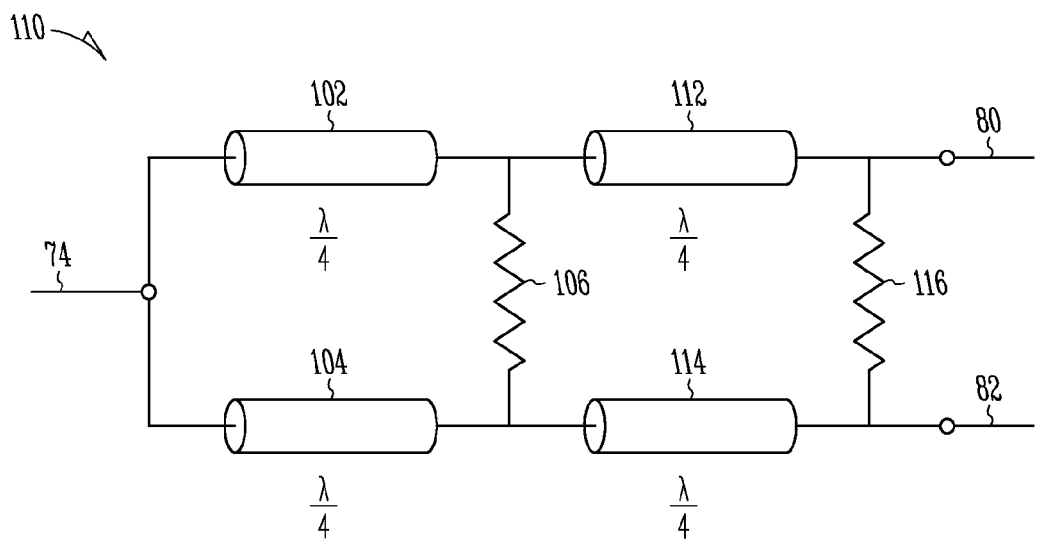
FIG. 8 is a schematic view of a divider unit according to various embodiments.

FIG. 8 is a schematic view of a divider unit 110 that also includes a first port 74 that may be coupled to the memory bus 18 (as shown in FIGS. 1-4), and a second port 80 and a third port 82 that may be coupled to respective memory units, such as the first memory unit 20 (as shown in FIG. 1) and the second memory unit 22 (as also shown in FIG. 1).

The divider unit 110 may also include a third transmission line transformer 112 and a fourth transmission line transformer 114 that are tuned to one-quarter of an operational wavelength λ. The third transmission line transformer 112 and the fourth transmission line transformer 114 may be serially coupled to the first transmission line transformer 102 and the second transmission line transformer 104, respectively, as well as to the second port 80 and the third port 82, respectively. An impedance 116, which may include a selected resistance, may also be coupled to the second port 80 and the third port 82. In order to match the first port 74, the second port 80, and the third port 82 to the impedance $Z_0$, the third transmission line transformer 112 and the fourth transmission line transformer 114 may be configured to provide a desired impedance, while the impedance 116 may appropriately selected based upon the impedance of the third transmission line transformer 112 and the fourth transmission line transformer 114 to appropriately adjust the impedance match provided by the divider unit 110. One skilled in the art will understand that suitable values for the foregoing elements may be readily determined by routine calculation.

Figure 9:
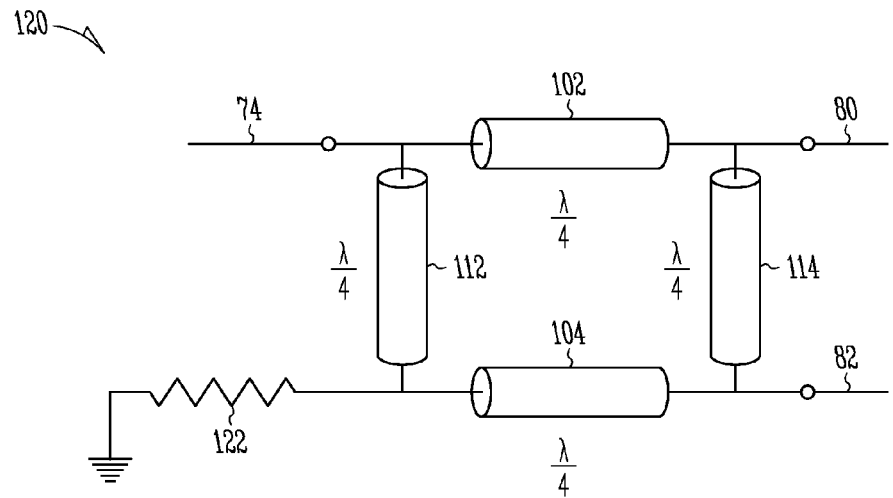
FIG. 9 is a schematic view of a divider unit according to various embodiments.

FIG. 9 is a schematic view of a divider unit that is also configured to be coupled to a first port 74, that may be coupled to the memory bus 18 (FIGS. 1-4). The second port 80 and the third port 82 may be configured to be coupled to respective memory units, such as the first memory unit 20 (as shown in FIG. 1) and the second memory unit 22 (as also shown in FIG. 1). The divider unit 120 may also include the first transmission line transformer 102 and the second transmission line transformer 104, which are serially coupled to the second port 80 and the third port 82, respectively. The second transmission line transformer 104 may also be serially coupled to an impedance 122, that is in turn coupled to a ground potential, perhaps provided by a ground plane. In this configuration, the third transmission line transformer 112 may shunt the first port 74 to the impedance 122, while the fourth transmission line transformer 114 may shunt the second port 80 to the third port 82. In order to achieve matched operation, the first transmission line transformer 102 and the second transmission line transformer 104 may be tuned to have an impedance of approximately $1/(\sqrt{2}Z_0)$, while the third transmission line transformer 112 and the fourth transmission line transformer may be tuned to have an impedance of $Z_0$. The impedance 122, which may be a pure resistance, may be selected to present an impedance of approximately $Z_0$.

Figure 10:
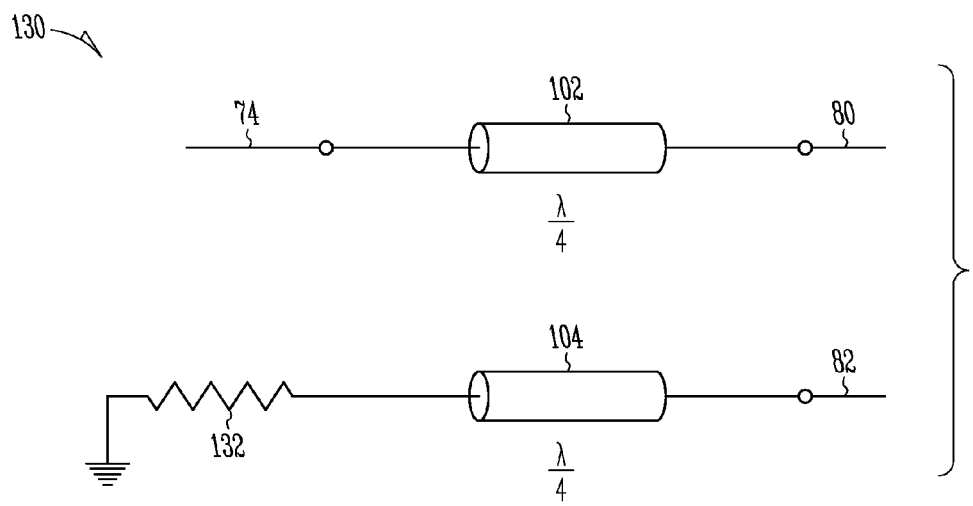
FIG. 10 is a schematic view of a divider unit according to various embodiments.

FIG. 10 is a schematic view of another divider unit 130 that is also configured to be coupled to a first port 74, that may be coupled to the memory bus 18 (FIGS. 1-4). The second port 80 and the third port 82 may be configured to be coupled to respective memory units, such as the first memory unit 20 (as shown in FIG. 1) and the second memory unit 22 (as also shown in FIG. 1). The divider unit 130 may also includes the first transmission line transformer 102 and the second transmission line transformer 104, which are serially coupled to the second port 80 and the third port 82, respectively. The first transmission line transformer 102 may be further coupled to the first port 72, while the second transmission line transformer 104 may be further coupled to an impedance 132, which may be further coupled to a ground potential, such as that provided by a ground plane. The impedance 132 may include a pure resistance.

Figure 11:
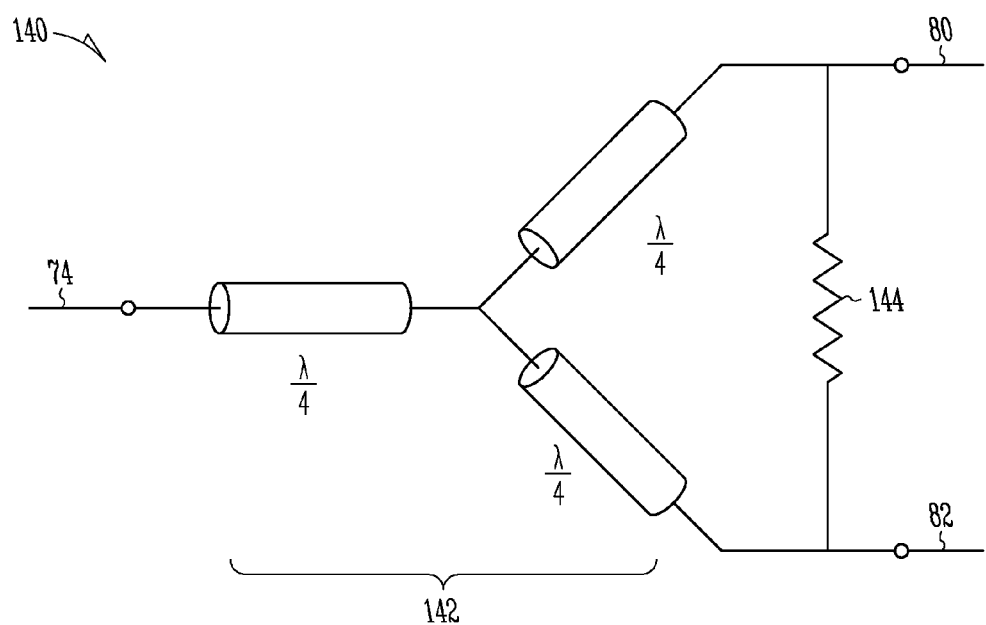
FIG. 11 is a schematic view of a divider unit according to various embodiments.

FIG. 11 is a schematic view of another divider unit 140 that may include a network of transmission line transformers 142, which may be arranged in a wye-coupled configuration. The network 142 may include transmission line transformers that are tuned to one quarter of an operational wavelength λ. A first port 74 of the divider unit 140 may be coupled to the memory bus 18 (FIGS. 1-4), while the second port 80 and the third port 82 may also be coupled to the network 142, and may also be shunted by an impedance 144, which may include a pure resistance. The second port 80 and the third port 82 may accordingly be coupled to separate memory units, as previously described.

Figure 12:
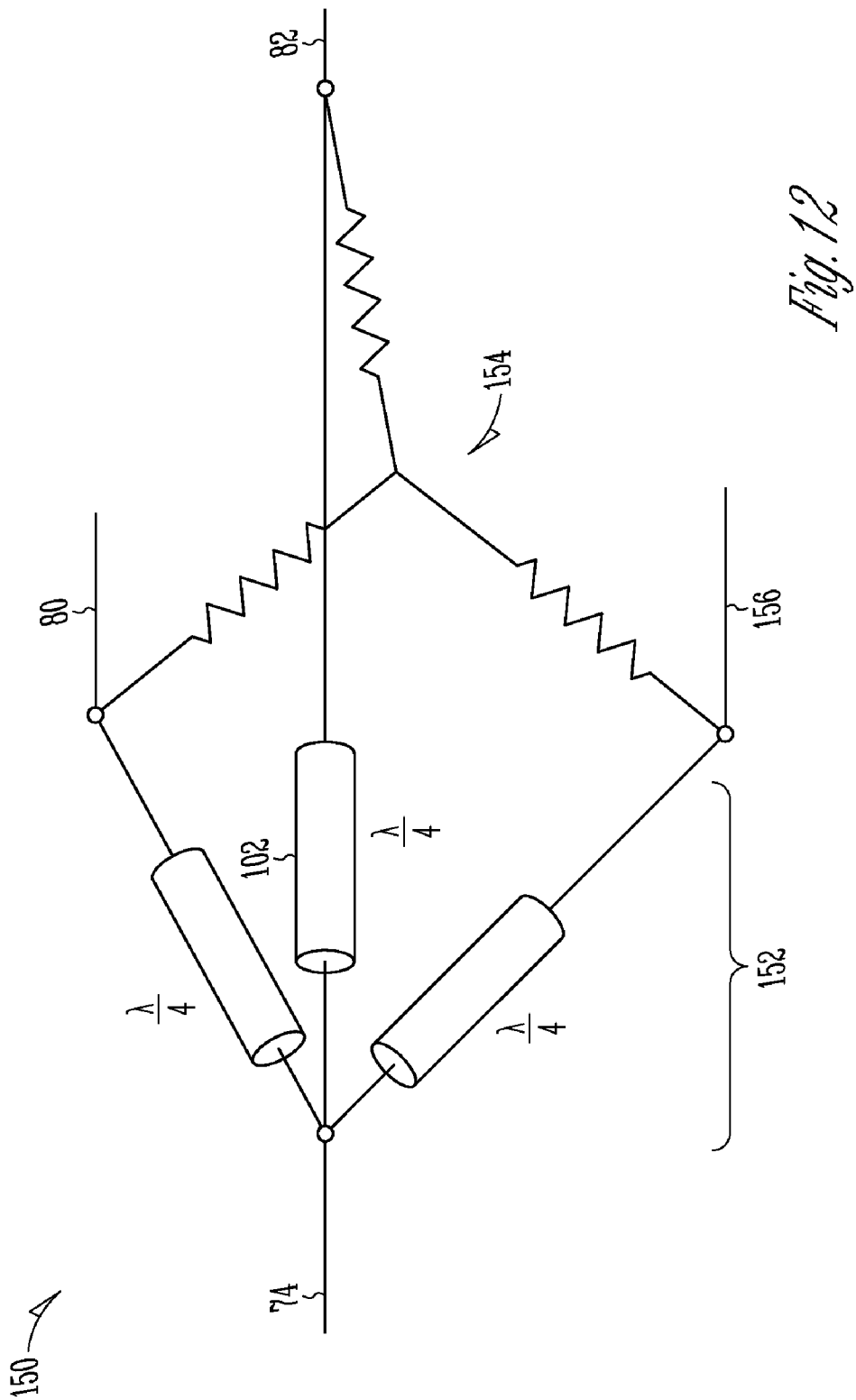
FIG. 12 is a schematic view of a divider unit according to various embodiments.

FIG. 12 is a schematic view of still another divider unit 150 that may include a transmission line transformer network 152 that may further include a star-coupled network of transmission line transformers, or still other configurations, which may be coupled to the memory bus 18 (FIGS. 1-4) at a first port 74. The opposing ends of the network 152 may be coupled to each of the nodes of a wye-coupled impedance network 154, which may include an arrangement of one or more pure resistances. Accordingly, the divider unit 150 may include a second port 80, a third port 82 and a fourth port 156 extending from each of the nodes of the impedance network 154, which may be coupled to separate memory units.

Figure 13:
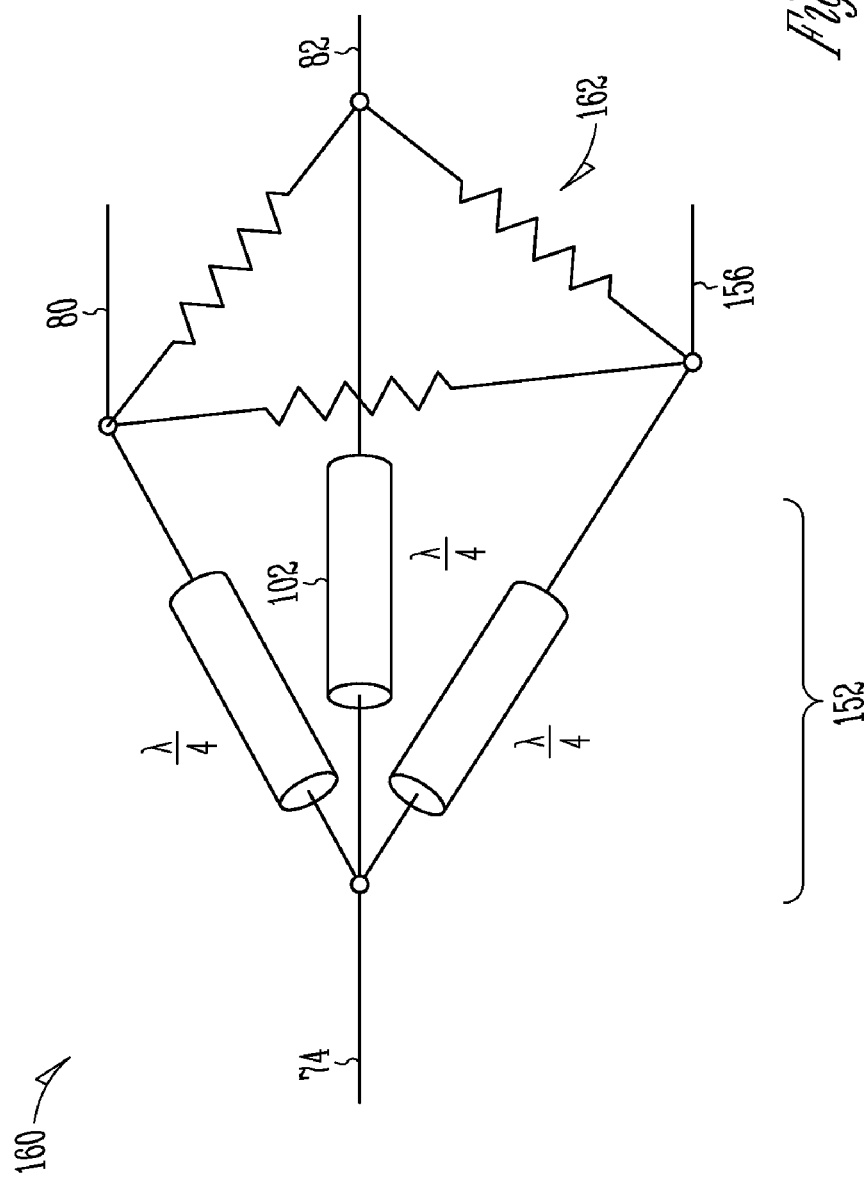
FIG. 13 is a schematic view of a divider unit according to various embodiments.

FIG. 13 is a schematic view of another divider unit 160. The unit 160 may include the transmission line transformer network 152 of FIG. 12 that is configured to be coupled to the memory bus 18 (FIGS. 1-4), with the opposing ends of the network 152 coupled to each of the nodes of a delta-coupled impedance network 162, which may include an arrangement of one or more pure resistances. Accordingly, the divider unit 160 may include the second port 80, the third port 82 and the fourth port 156 extending from each of the nodes of the impedance network 154, which may be further coupled to separate memory units. Although the various embodiments shown in FIG. 12 and FIG. 13 show three output nodes (e.g., the second port 80, the third port 82 and the fourth port 156), it is understood that the various embodiments shown in FIG. 12 and FIG. 13 may conveniently be extended to provide n output nodes, which may be individually coupled to separate memory units. For example, one (or two) resistors could be added to mirror the wye (or delta) coupled impedance networks in FIG. 12 (or FIG. 13), and another transformer could be added to the network 152 to provide a four output nodes, and so on.

Figure 14:
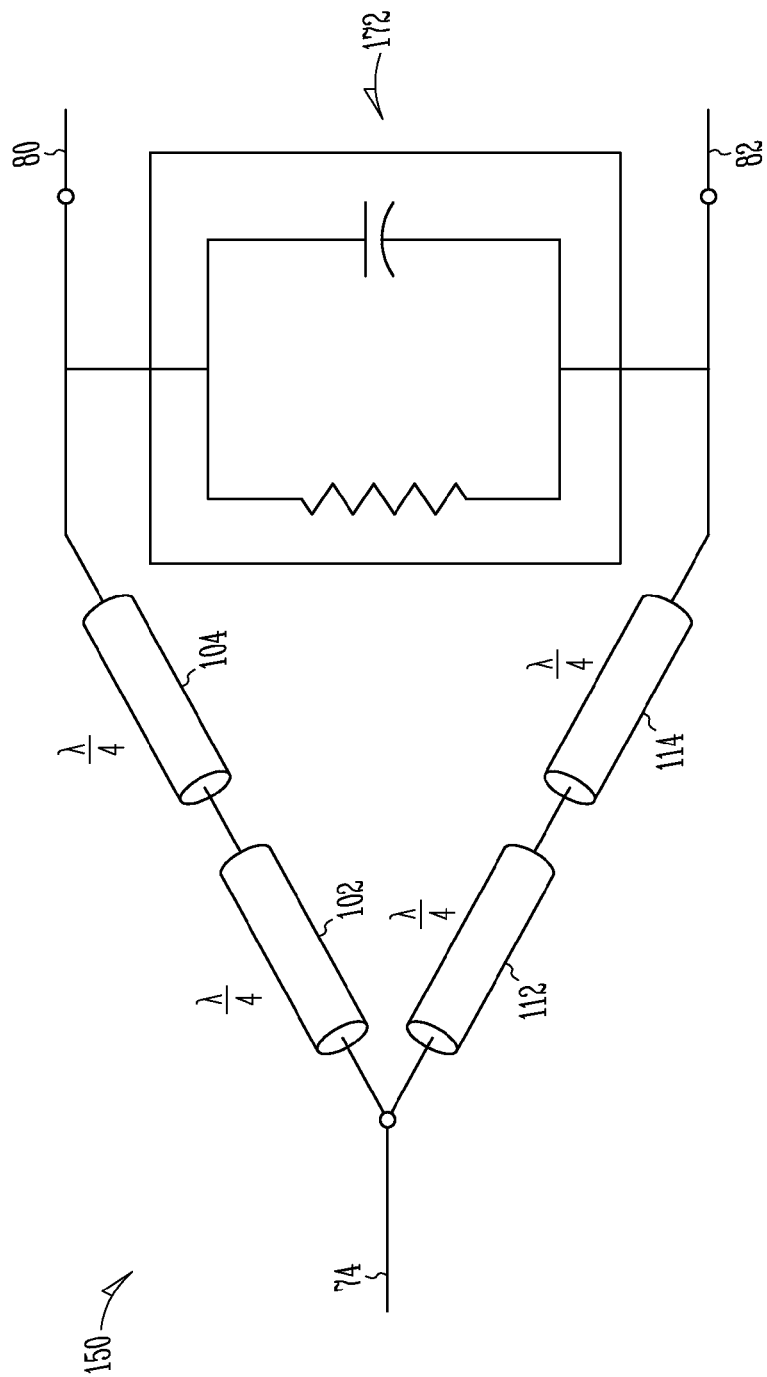
FIG. 14 is a schematic view of a divider unit according to various embodiments.

FIG. 14 is a schematic view of another divider unit 170 that may be configured to be coupled to the memory bus 18 (FIGS. 1-4) through the first port 74. The first transmission line transformer 102 and the second transmission line transformer 104 may be serially coupled to the second port 80, while the third transmission line transformer 112 and the fourth transmission line transformer 114 may be serially coupled to the third port 82. An impedance network 172 may be coupled to the second port 80 and the third port 82 so that the impedance network 172 shunts the second port 80 and the third port 82. The impedance network 172 may include a parallel combination of a selected pure resistance and capacitance. Alternatively, the impedance network 172 may include a selected pure resistance in series with a capacitor.

Figure 15:
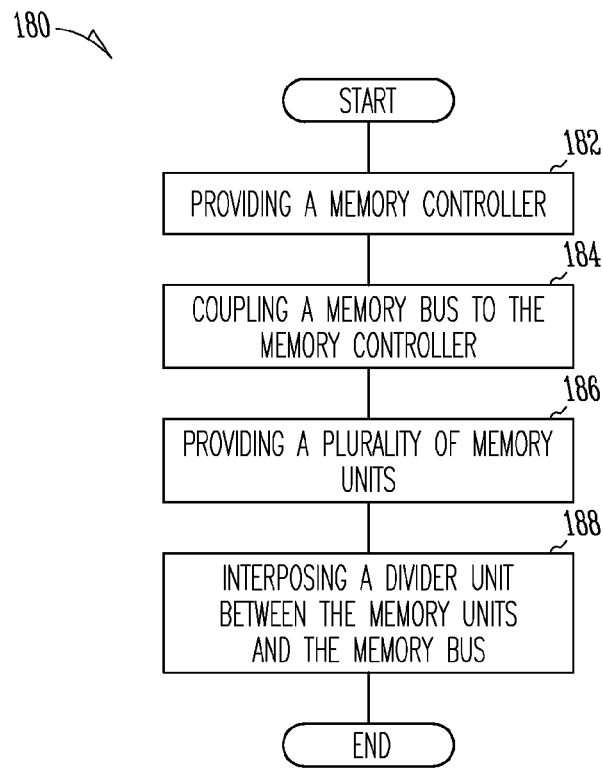
FIG. 15 is a flowchart for a method of configuring a memory system according to various embodiments.

FIG. 15 is a flowchart that will be used to describe a method 180 of configuring a memory system. At block 182, a memory controller is provided that is operable to control communications between a processing unit and a plurality of memory units. At block 184, a memory bus is coupled to the memory controller. At block 186, a plurality of memory units are provided, which may include individual memory devices, such as a DRAM, an SRAM, an SDRAM, a DDR SDRAM, and a flash memory device, as well as other suitable memory devices. The memory units may also include memory modules having a plurality of discrete memory devices, such as a DIMM, a DDR SDRAM, a DDR2 SDRAM, a DDR3 SDRAM, or other suitable memory modules. At block 188, a divider unit may be interposed between the memory bus and the memory units. The divider unit is operable to match an impedance of the memory units to an impedance of the bus, while providing for signal isolation between the memory modules.

Figure 16:
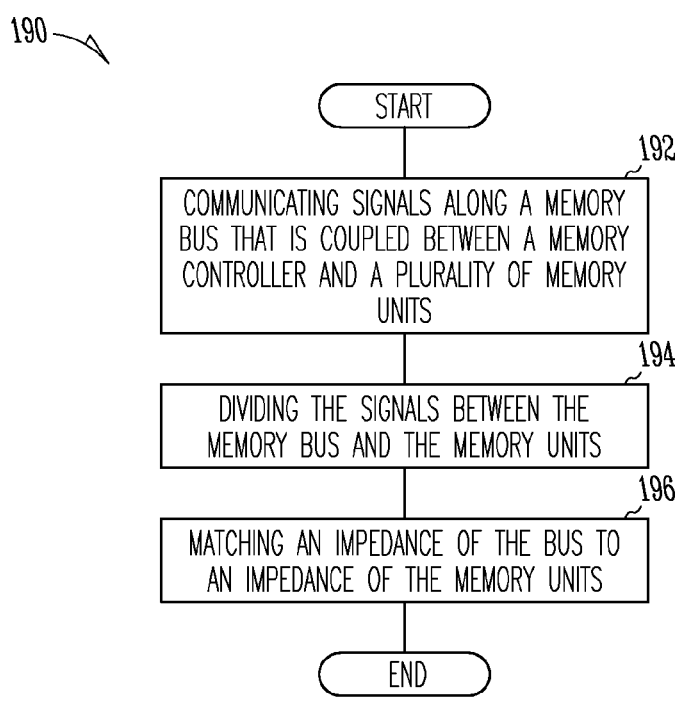
FIG. 16 is a flowchart for a method of operating a memory system according to various embodiments.

FIG. 16 is a flowchart that will be used to describe a method 190 of operating a memory system. At block 192, signals are communicated along a memory bus that is coupled between a memory controller and a plurality of memory units. As previously discussed, the memory units may include individual memory devices, or they may include memory modules. At block 194, the signal levels communicated along the memory bus are divided by at least one divider unit that is coupled to the bus and the memory units. At block 196, a substantially matched impedance between the memory units and the memory bus is provided by at least one divider unit. The divider unit may also provide signal isolation for the memory units. Since it is understood that the memory bus is bidirectional, the signals may also be combined by the divider unit as signals are communicated from the memory units to the memory bus.

Implementing the systems and methods disclosed herein may provide memory systems having improved bandwidth characteristics. The various embodiments may be conveniently provided using passive electrical elements, or a combination of passive and active elements.

While the various embodiments of the invention have been illustrated and described, as noted above, many changes can be made without departing from the scope of this disclosure. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. Furthermore, although the various embodiments been described with reference to memory systems and devices, it is understood that the various embodiments may be employed in a variety of known electronic systems and devices without modification of any kind. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A system, comprising:
at least one divider unit interposed between a memory bus and at least two memory units, wherein the at least one divider unit comprises an interconnected network that includes impedances in an arrangement having an input port and at least two output ports, wherein the at least one divider unit comprises a wye network coupled to the input port and the at least two output ports, and wherein the at least one divider unit comprises an interconnected network including an arrangement of transmission line transformers and resistances.

2. The system of claim 1, wherein the divider unit is configured to provide at least one of approximately equally divided signal levels communicated by the communications channel, and to match an impedance of the communications channel to an impedance of the memory units.

3. The system of claim 1, further comprising:
a processor;
a memory controller communicatively coupled to the processor; and
a communications channel configured to communicate with the at least two memory units.

4. A system, comprising:
at least one divider unit interposed between a memory bus and at least two memory units, wherein the at least one divider unit comprises an interconnected network that includes impedances in an arrangement having an input port and at least two output ports, and wherein the at least one divider unit comprises a delta network coupled to the input port and the at least two output ports;
a memory controller communicatively coupled to a processor; and
a communications channel configured to communicate with the at least two memory units, wherein the divider unit is configured to provide at least one of approximately equally divided signal levels communicated by the communications channel, and to match an impedance of the communications channel to an impedance of the memory units.

5. A system, comprising:
at least one divider unit interposed between a memory bus and at least two memory units, wherein the at least one divider unit comprises an input port and at least two output ports, and wherein an active signal amplification device is coupled to at least one of the output ports.

6. The system of claim 5, further comprising:
a communications channel configured to communicate with the at least two memory units, wherein the divider unit is configured to provide at least one of approximately equally divided signal levels communicated by the communications channel, and to match an impedance of the communications channel to an impedance of the memory units.

7. A system, comprising:
at least one divider unit interposed between a memory bus and at least two memory units,
wherein the at least one divider unit comprises a first divider unit having at least two output ports and an input port coupled to the memory bus, and wherein the at least two output ports are coupled to secondary divider units coupled to the memory units.

8. An apparatus, comprising:
a divider unit coupled to a memory bus and a plurality of memory units, wherein the divider unit comprises an input port configured to be coupled to the memory bus and at least two output ports configured to be coupled to the plurality of memory units, and wherein the divider unit further comprises an interconnected network having at least two transmission line transformers commonly coupled to the input port and to respective output ports, and at least one resistance coupled between at least two of the respective output ports.

9. The apparatus of claim 8, wherein the divider unit is configured to communicate signals as communicated signals between the memory bus and the plurality of memory units.

10. The apparatus of claim 9, wherein the divider unit is configured to approximately equally divide levels of the communicated signals while matching an impedance of the memory bus to an impedance of the memory units.

11. A divider unit, comprising:
an impedance network configured to be coupled to a memory bus and to a plurality of memory units;
a plurality of passive elements; and
one or more signal boosting units interposed between the plurality of passive elements and the plurality of memory units.

12. The divider unit of claim 11, wherein the resistance network is configured to approximately equally divide levels of signals communicated between the memory bus and the plurality of memory units while matching an impedance of the memory bus to an impedance of the memory units.

13. The divider unit of claim 11, wherein the impedance network comprises a wye-coupled network.

14. The divider unit of claim 11, wherein the impedance network comprises a delta-coupled network.

15. The divider unit of claim 11, further comprising:

a network of transmission line transformers coupled to the impedance network.

16. The divider unit of claim 15, wherein the network of transmission line transformers comprises a wye-coupled network of transmission line transformers.

17. The divider unit of claim 15, wherein the network of transmission line transformers comprises a star-coupled network of transmission line transformers.

18. The divider unit of claim 15, wherein the network of transmission line transformers comprises at least a pair of serially-coupled transmission line transformers.

* * * * *